US009755181B2

(12) United States Patent
Odaka et al.

(10) Patent No.: US 9,755,181 B2
(45) Date of Patent: Sep. 5, 2017

(54) DISPLAY DEVICE

(71) Applicant: Japan Display Inc., Tokyo (JP)

(72) Inventors: Kazuhiro Odaka, Tokyo (JP); Naoki Tokuda, Tokyo (JP); Hiroshi Tabatake, Tokyo (JP)

(73) Assignee: Japan Display Inc., Tokyo (JP)

( * ) Notice: Subject to any disclaimer, the term of this patent is extended or adjusted under 35 U.S.C. 154(b) by 13 days.

(21) Appl. No.: 14/835,180

(22) Filed: Aug. 25, 2015

(65) Prior Publication Data

US 2016/0064686 A1 Mar. 3, 2016

(30) Foreign Application Priority Data

Sep. 3, 2014 (JP) ................................ 2014-178808

(51) Int. Cl.
*H01L 21/00* (2006.01)
*H01L 51/52* (2006.01)
*H01L 27/32* (2006.01)

(52) U.S. Cl.
CPC ........ *H01L 51/5246* (2013.01); *H01L 27/322* (2013.01)

(58) Field of Classification Search
None
See application file for complete search history.

(56) References Cited

U.S. PATENT DOCUMENTS

2002/0131009 A1 9/2002 Takeuchi
2006/0279207 A1* 12/2006 Kim ..................... G02F 1/1345 313/506

FOREIGN PATENT DOCUMENTS

JP 2002-277884 A 9/2002
JP 2012-220781 A 11/2012

* cited by examiner

*Primary Examiner* — Reema Patel
(74) *Attorney, Agent, or Firm* — Typha IP LLC

(57) ABSTRACT

A display device including a first substrate provided with a plurality of display elements, a second substrate provided facing the display element, a bonding material bonding the first substrate and second substrate, a first wall part provided over the second substrate side of the first substrate and enclosing a display region facing a position of the display element, a second wall part provided over the first substrate side of the second substrate and enclosing a structure body facing a position of the display element and a display region, the first wall part comprises the same material as at least part of the material constituting the display element, the second wall part is provided from the same material as at least part of the material constituting the structure body, and the first wall part and second wall part are in contact using the bonding material in the display region side.

11 Claims, 14 Drawing Sheets

20e
900G
900R
700
400
200
10e
B'
E2
E1
830
950
820
2
1
900B
250
D1
300
B
20
810
700
600
500
400
200
110
10

E2
900G
900R
950
825
2Y
900B
815
20Y
700
400
200
E1
1Y
D1
10Y 20e
950
900G
900R
700
400
200
E2
E1
950S
820
950
2
1
900B
D1
20
10

DISPLAY DEVICE

CROSS REFERENCE TO RELATED APPLICATIONS

This application is based upon and claims the benefit of priority from the prior Japanese Patent Application No. 2014-178808 filed on Sep. 3, 2014, the entire contents of which are incorporated herein by reference.

FIELD

The present invention is related to a display device.

BACKGROUND

In a display device which uses a light emitting element such as an OLED (Organic Light Emitting Diode), there is a method for displaying an image using an element which emits white light and a color filter including a pigment corresponding to each color R, G, B as a method for displaying a color image.

This type of display device is generally manufactured using an OLED, a substrate formed with a transistor for driving the OLED and bonding the substrate formed with a color filter and the like. A shield material is sometimes provided on an exterior periphery part of the substrate in order to block the OLED from the outside air when bonding the substrates.

Control of the dimensions of a shield material becomes poor during formation, spreads when bonding the substrate and is easy to protrude from its intended arrangement location. A shield material is also used for sealing liquid crystals in the field of liquid crystal displays, for example, in Japanese Laid Open Patent No. 2002-277884 and Japanese Laid Open Patent No. 2012-220781 which disclose a technique for controlling a shield material from protruding.

SUMMARY

A display device including a first substrate provided with a plurality of display elements, a second substrate provided facing the display element, a bonding material bonding the first substrate and second substrate, a first wall part provided over the second substrate side of the first substrate and enclosing a display region facing a position of the display element, a second wall part provided over the first substrate side of the second substrate and enclosing a structure body facing a position of the display element and a display region, the first wall part comprises the same material as at least part of the material constituting the display element, the second wall part is provided from the same material as at least part of the material constituting the structure body, and the first wall part and second wall part are in contact using the bonding material in the display region side.

DESCRIPTION OF EMBODIMENTS

Each embodiment of the present invention is explained below while referring to the diagrams. Furthermore, the disclosure is merely an example and appropriate modifications could be easily conceived of by a person ordinarily skilled in the art while maintaining the object of the invention and are obviously included in the scope of the present invention. In addition, in order to further clarify explanation, the diagrams are only examples, are sometimes represented schematically such as the width, thickness and shape of each component compared to actual components and should not limit an interpretation of the present invention. In addition, in the specification and each diagram, components that have been described in previous diagrams are attached with the same reference symbols and a detailed explanation is sometimes omitted.

As an effect of a seal material protruding, when the seal material spreads as far as the position where each device is cut from a large substrate for example, this sometimes affects cutting of the substrate. Therefore, it is necessary to design a cutting position while considering the amount by which the seal material spreads and waste such as the frame section of the display occurs.

One embodiment of the present invention aims to control spreading of a bonding material used when bonding a substrate towards a cutting position of a substrate.

First Embodiment

[Approximate Structure]

The display device in one embodiment of the present invention is an organic EL (Electro-luminescence) display device using an OLED. The organic EL display device in this example uses an OLED which emits white light. The white light emitted from this OLED is passed through a color filter to obtain a color image.

A display device is formed by bonding together a first substrate and a second substrate. Drive elements such as a thin film transistor and other elements for controlling the light emitting state of an OLED are provided in the first substrate. A color filter and other layers is formed in the second substrate.

The light from an OLED provided in the first substrate is output to the opposite side of the first substrate side, passes through a color filter provided in the second substrate to be observed by a user in what is called a top emission type device.

In the display device in one embodiment of the present invention, it is possible to control spreading of a bonding material to the end part side of a substrate as is explained herein and as a result it is also possible to control the position of an end part of a bonding material to a degree of accuracy.

[External Structure of a Display Device 1000]

Figure 1:
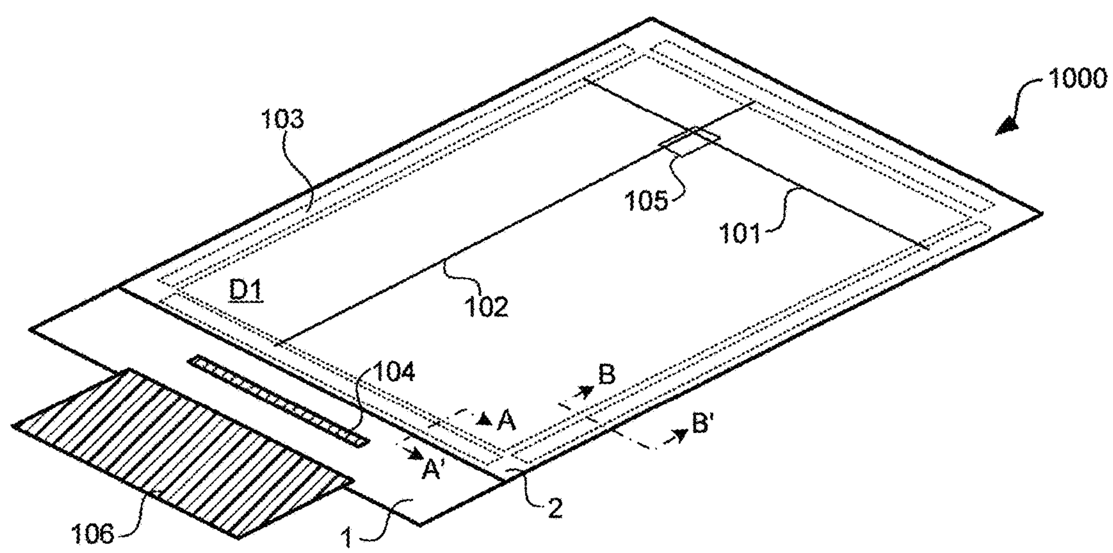
FIG. 1 is a planar view diagram showing an approximate structure of a display device in the first embodiment of the present invention.

FIG. 1 is a planar view showing an approximate structure of a display device 1000 in one embodiment of the present invention. The display device 1000 is provided with a first substrate 1 which is provided with a display region D1 and a scanning line drive circuit 103, and a second substrate 2 which is provided so as to cover the display region D1 and scanning line drive circuit 103. In addition, the display device 1000 is also provided with a driver IC 104 and FPC (Flexible Printed Circuit) 106 attached to the first substrate 1. A color filter and the like is provided in the second substrate 2.

A scanning line 101 and a data signal line 102 which intersects perpendicularly with the scanning line 101 are provided in the display region D1. A pixel 105 is provided in a position corresponding to the intersection part between the scanning line 101 and data signal line 102. The pixel 105 is provided in a matrix shape. Furthermore, in FIG. 1, although one signal line extends in a direction along the scanning line 101 or data signal line 102 for each pixel 105, a plurality of signal lines may also be provided. In addition, wiring which supplies a certain voltage such as a power source line may also be provided in the display region D1.

The scanning line drive circuit 103 supplies a control signal to the scanning line 101. The driver IC 104 supplies a data voltage to the data signal line 102 and controls the scanning line drive circuit 103. Furthermore, other drive circuits may be provided in the periphery of the display region D1.

A display element including a pixel circuit which controls emitted light based on a control signal and a data voltage and a light emitting element (OLED) which emits light controlled by the pixel circuit are provided in each pixel 105. The pixel circuit includes a thin film transistor and condenser for example, drives the thin film transistor based on a control signal and data voltage and controls a light emitting element. An image is displayed in the display region D1 by controlling the emitting light.

[Cross-Sectional Structure of the Display Device 1000]

Next, a cross-sectional structure of the display device 1000 is explained. A cross-sectional structure in the vicinity of and part of a substrate is explained in order to further clarify the characteristic components of the present embodiment. A schematic view of a cross-sectional structure along the line A-A' and B-B' in FIG. 1 is explained in detail below.

Figure 2:
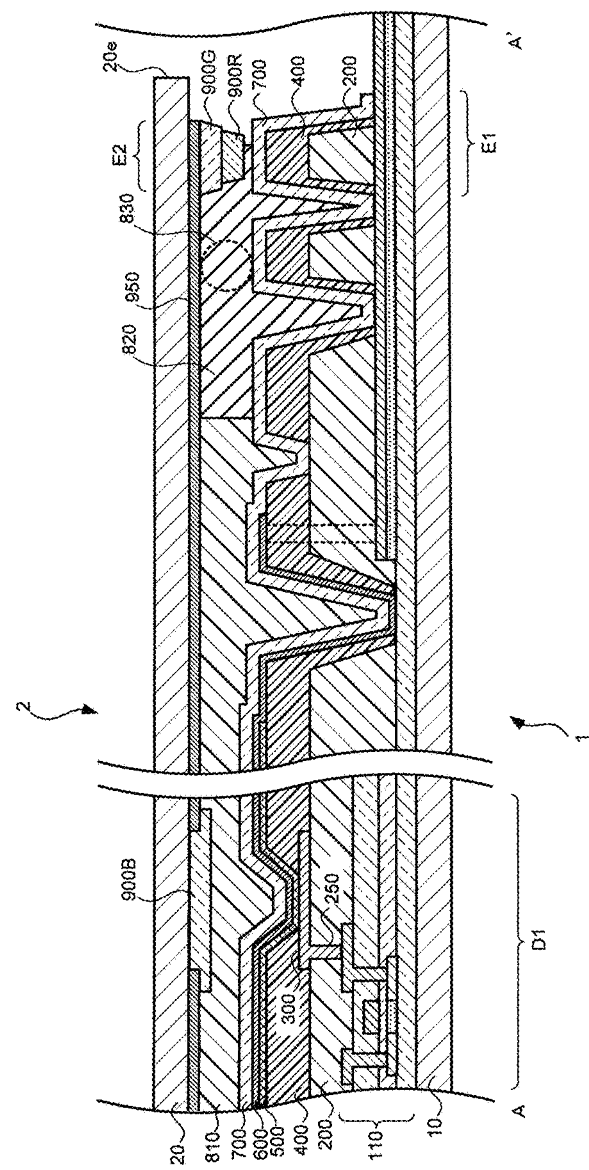
FIG. 2 is a cross-sectional diagram showing a cross-sectional structure (cross-section along the line A-A' in FIG. 1) of a display device in the first embodiment of the present invention.
Figure 3:
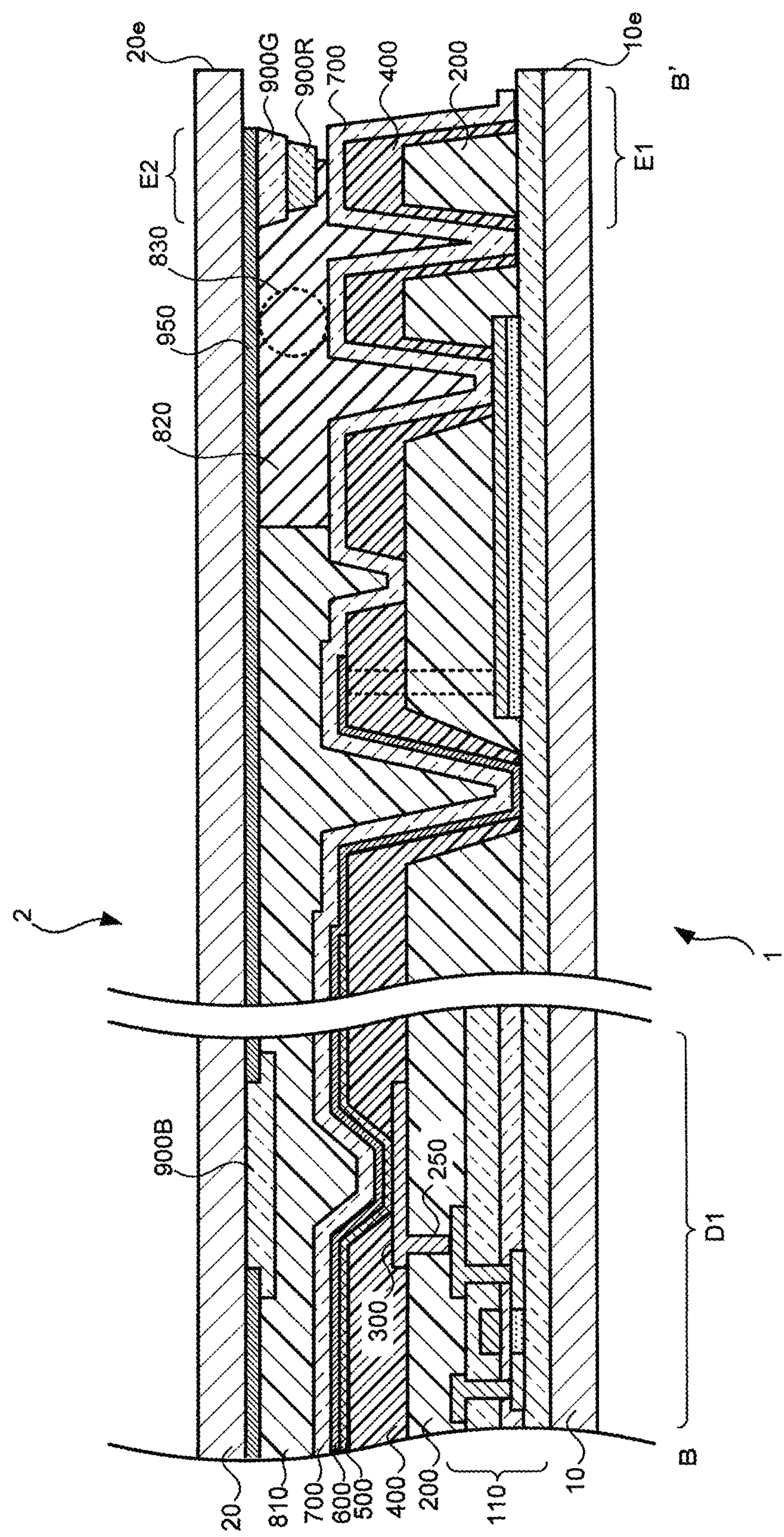
FIG. 3 is schematic diagram showing a cross-sectional structure (cross-section along the line B-B' in FIG. 1) of a display device in the first embodiment of the present invention.

FIG. 2 is a schematic diagram showing a cross-sectional structure (cross-sectional structure along the line A-A' in FIG. 1) of the display device in the first embodiment of the present invention. FIG. 3 is a schematic diagram showing a cross-sectional structure (cross-sectional structure along the line B-B' in FIG. 1) of the display device in the first embodiment of the present invention. FIG. 2 and FIG. 3 show end surface views corresponding to each cross-sectional line. Each schematic diagram showing a cross-sectional structure herein is shown as end surface views.

A first support substrate 10 in the first substrate 1 and a second support substrate 20 in the second substrate 2 are glass substrates. Furthermore, one or both of the first support substrate 10 and second support substrate 20 may be organic resin substrate having flexibility.

The structure of the first substrate 1 is explained. A thin film transistor 110 is provided above the first support substrate 10. An interlayer insulation layer 200 is provided to cover the thin film transistor 110. A pixel electrode 300 is provided above the interlayer insulation layer 200. The interlayer insulation layer 200 is formed with a desired pattern by, for example, coating a photosensitive acrylic resin and performing exposure, development and sintering. Furthermore, although the interlayer insulation layer 200 is a single layer in FIG. 3, the interlayer insulation layer 200 may also be a stacked layer of a plurality of insulation films. In this case, wiring may be provided between the pluralities of insulation films.

The pixel electrode 300 is connected to the thin film transistor 110 via a contact hole 250 formed in the interlayer insulation layer 200. Since the display device 1000 displays an image using a top emission type method, it is not necessary that the pixel electrode 300 have translucency. Therefore, the pixel electrode 300 may include a layer which reflects light output by an OLED. In this example, the pixel electrode 300 includes a metal oxide such as ITO (Indium Tin Oxide), IZO (Indium Zinc Oxide) and an electrode which reflects light on a lower layer thereof which serves as an anode electrode of the OLED.

A bank layer 400 covers an end part of the pixel electrode 300 and the space between adjacent pixels and are provided with an aperture part which exposes one part of the pixel electrode 300. The bank layer 400 is formed with a desired pattern by coating a photosensitive acrylic resin and performing exposure, development and sintering.

A light emitting layer 500 of the OLED is covering the pixel electrode 300 and bank layer 400. A transparent electrode 600 covers the light emitting layer 500 and forms a cathode electrode of the OLED. The transparent electrode 600 is an electrode which allows light from the OLED to pass through and includes, for example, a metal oxide such as ITO, IZO or a thin metal layer to the extent that light can pass through.

When a current is supplied to the light emitting layer 500 via the pixel electrode 300 and transparent electrode 600, light which displays an image is output via the transparent electrode 600. As a result, a region of the pixel electrode 300 exposed by the bank layer 400 becomes a light emitting region.

A sealing layer 700 is a layer for controlling water from reaching the light emitting layer 500 or components which deteriorate the light emitting layer such as glass and is an inorganic insulation later such as silicon nitride covering the transparent electrode 600.

A first wall part E1 is provided to enclose the display region D1 and periphery circuits and the like. In this example, the first wall part E1 is formed by stacking the interlayer insulation layer 200, bank layer 400 and sealing layer 700. At this time, in the case where the interlayer insulation layer 200 and the bank layer 400 are formed from organic materials, these may also be provided so that a path formed from an organic material does not exist between the outer side and inner side of the first wall part E1 by being enclosed by the sealing layer 700. Furthermore, the first wall part E1 includes a structured body formed in the display region D1, that is, at least a part of a material forming a display element, and if a wall is formed so as to enclose at least the display region D1, this is not limited to a stacked structure. The above is an explanation of the first substrate 1.

Next, the structure of the second substrate 2 is explained. A light shielding layer 950 and color filters 900R, 900G and 900B corresponding to red (R), green (G) and blue (B) are provided in the second support substrate 20. The light shielding layer 950 is formed from a material having light shielding properties such as metal. In addition, the light shielding layer 950 in this example is formed at a boundary part of pixels which are different colors and in a region on the outer side of the display region D1.

The color filters 900R, 900G and 900B are provided corresponding to a light emitting region in each pixel. The color filters 900R, 900G and 900B are formed with a desired pattern by coating a photosensitive resin including a pigment forming each color, and by performing exposure, development and sintering. The filters may also be formed by a printing method or inkjet method. Furthermore, the color filter 900B is shown as example of an arrangement corresponding to a light emitting region in FIG. 2 and FIG. 3 and the color filters 900R and 900G are omitted.

A second wall part E2 is provided in a position facing the first wall part E1. The second wall part E2 in this example is formed by stacking the color filters 900G and 900R above the light shielding layer 950. Furthermore, the second wall part E2 includes a structured body formed in the display region D1, that is, the second wall part E2 includes at least one part of the light shielding layer 950 and color filters 900R, 900G and 900B, and if the second wall part E2 faces the first wall part E1 and is forms a wall which encloses at least the display region D1 then it is not limited to a stacked structure. That is, the second wall part E2 may have a structure stacked with a combination of different material and may have two or more stacked layers or be a single layer. The above explained the second substrate 2. In addition, a material other than the light shielding layer 950 and color filters 900R, 900G and 900B may be included in the structured body formed in the display region D1 in the second substrate 2. In this case, the second wall part E2 may be formed using a material other than the light shielding layer 950 and color filters 900R, 900G and 900B.

A first bonding material 810 and a second bonding material 820 are material for bonding the first substrate 1 and second substrate 2 and may be an acrylic resin for example. The first bonding material 810 is provided in at least the display region D1. Therefore, the first bonding material 810 includes translucency. Since the first bonding material 810 is filled between the first substrate 1 and second substrate 2, an expression such as filler material may sometimes be used.

The second bonding material 820 is provided on the outer side (exterior periphery side) of the first bonding material 810 and is connected to a least one part of the second wall part E2. A spacer 830 may also be provided in the second bonding material 820 for maintaining a desired gap so that the first substrate 1 and second substrate 2 do not come closer than a certain distance.

Since the second bonding material 820 is provided on the outer side of the display region D1, the second bonding material 820 may have a lower transparency in a certain wavelength in visible light than the first bonding material 810. In addition, the second bonding material 820 may gave a greater strength for bonding the first substrate 1 and second substrate 2 then the first bonding material 810. Since the second bonding material 820 strongly bonds the first substrate 1 and second substrate 2 and has a role of preventing the first bonding material 810 from flowing from a certain region, an expression such as dam material is sometimes used. Furthermore, what is meant by bonding strength here refers to adhesion per unit area seen from a planar view. Therefore, since the first bonding material 810 is formed to cover the entire surface of the display region D1 which exists in the majority of the region of the first substrate 1 and second substrate 2, the adhesion of the entire first bonding material 810 becomes higher than the adhesion of the entire second bonding material 820. However, the adhesion force per unit area is in a reverse relationship.

In this example, the first wall part E1 and the second wall part E2 face each other sandwiching the second bonding material 820 without contacting each other. Furthermore, the second bonding material 820 is not limited to existing in the entire region between the first wall part E1 and second wall part E2. That is, a region may exist between the first wall part E1 and the second wall part E2 where the second bonding material 820 does not exist.

With respect to three edges apart from the edge on the side on which the FPC 106 is attached in the first substrate 1, as is shown in FIG. 3, an end part 10*e* of the first support substrate 10 and an end part 20*e* of the second support substrate 20 are positioned in the vicinity of the outer side of the first wall part E1 and second wall part E2 and face other. On the other hand, with respect to the edge on the side on which the FPC 106 is attached in the first substrate 1, as is shown in FIG. 2, although the end part 20*e* of the second support substrate 20 is positioned in the vicinity of the outer side of the first wall part E1 and second wall part E2, the substrate end part of the first support substrate 10 is positioned in a location separated from the end part 20*e*.

Movement of an end part (end part of the first wall part E1 and second wall part E2) in the substrate outer side direction of the second bonding material 820 is controlled by the first wall part E1 and second wall part E2. As explained above, because the first wall part E1 and second wall part E2 are formed using photolithography, the position of the first wall part E1 and second wall part E2 can be accurately controlled more than the position of the second bonding material 820 formed by discharge of a material. Therefore, because the distance between the end part 10*e* of the first support substrate 10 and the first wall part E1, and the distance between the end part 20*e* of the second support substrate 20 and the second wall part E2 can be reduced, it is possible to reduce a margin between a position where the substrate is cut and the second bonding material, coat the second bonding material further to the exterior and reduce a frame region.

[Method of Bonding the First Substrate and Second Substrate]

A first large substrate 1Y before being separated into a plurality of first substrate 1 and a second large substrate 2Y before being separated into a plurality of second substrate 2 are bonded together and following this the first large substrate 1Y and second large substrate 2Y are cut to a desired size. In this way, the first substrate 1 and second substrate 2 are bonded and separated into the display device 1000.

Figure 4:
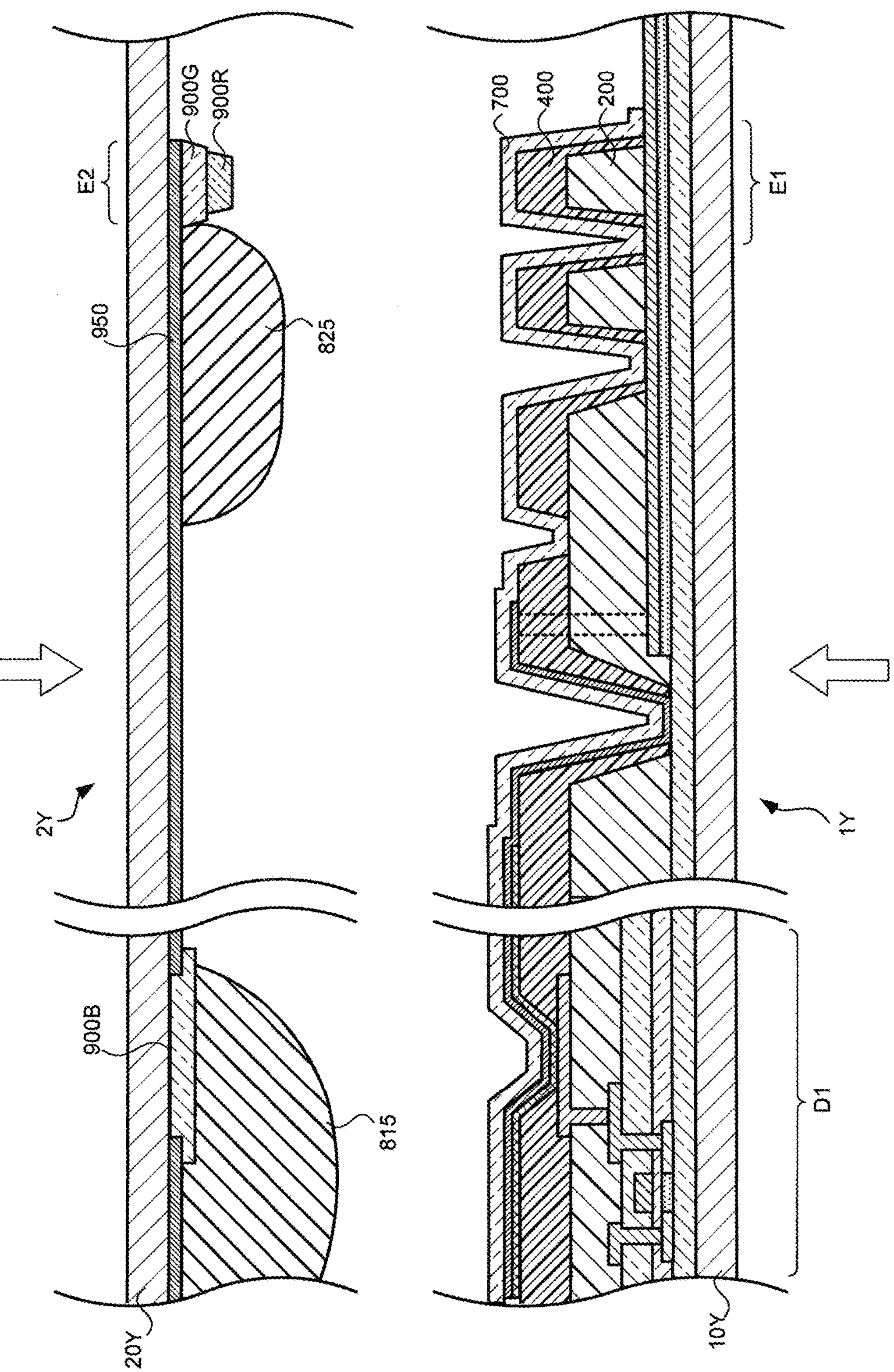
FIG. 4 is a diagram explaining a bonding method of a first substrate and a second substrate in the first embodiment of the present invention.

FIG. 4 is a diagram explaining a method for bonding the first substrate 1 and second substrate 2 in the first embodiment of the present invention. The first bonding material 815 before curing and the second bonding material 825 before curing are discharged to the second large substrate 2Y formed with the light shielding layer 950 and color filters 900R, 900G and 900B. The first bonding material 815 is discharged to the display region D1. Furthermore, the first bonding material 815 may also be discharged to the first large substrate 1Y.

The second bonding material 825 is discharged to the vicinity of the display region D1 side of the second wall part E2. At this time, although the second bonding material 825 spreads from the region where it is discharged to depending on the its viscosity, spreading to the second wall part E2 side is controlled by the second wall part E2. Furthermore, the second bonding material 825 has a higher viscosity than the first bonding material 810.

Figure 5:
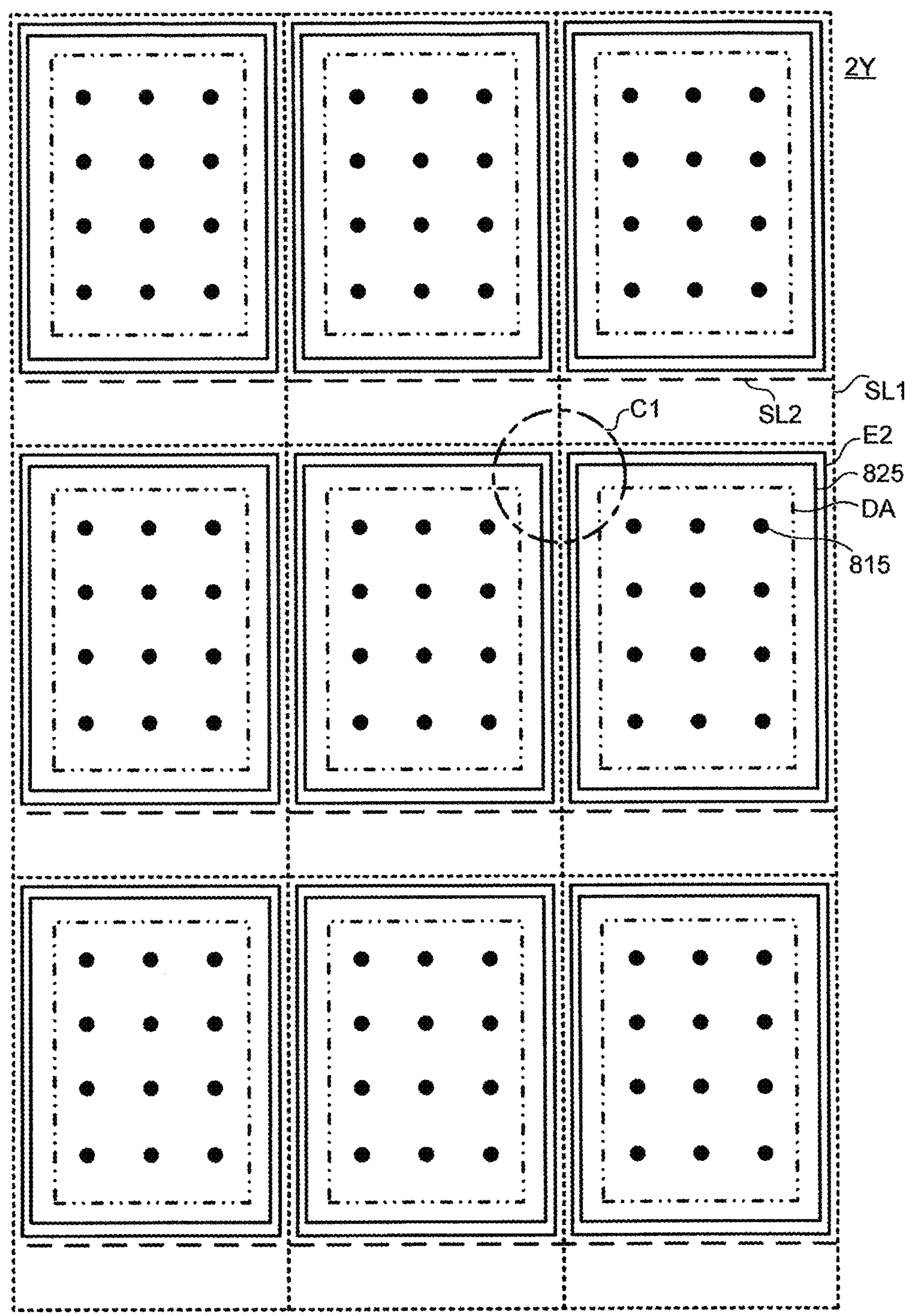
FIG. 5 is a planar view diagram showing an approximate structure of a second large substrate in the first embodiment of the present invention.
Figure 6:
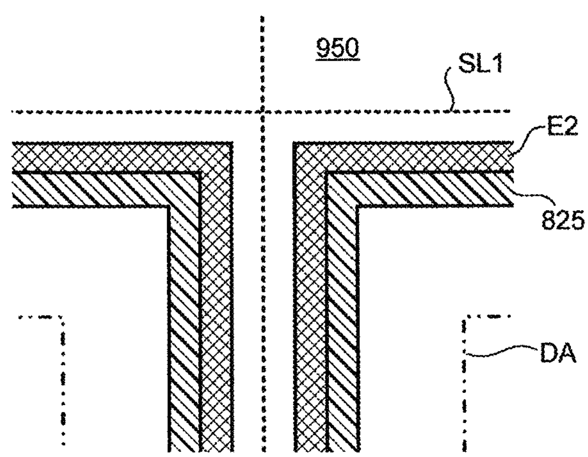
FIG. 6 is an expanded diagram of the region C1 in FIG. 5.

FIG. 5 is a planar view diagram showing an approximate structure of a second large substrate in the first embodiment of the present invention. FIG. 6 is an expanded view of the region C1 in FIG. 5. FIG. 5 is s diagrams showing a partial region (nine parts of the display device 1000) of the second large substrate 2Y. The broken lines SL1, SL2 show the position where the second large substrate 2Y is cut. Furthermore, the broken line SL1 corresponding to the exterior periphery of the display device 1000 and the broken line SL2 is a position corresponding to the end part 20*e* of the second support substrate 20.

The first bonding material 815 is discharged to a plurality of locations separated by an interval in the display region D1. When the first large substrate 1Y and second large substrate 2Y shown in FIG. 4 are bonded together, the first bonding material 815 pushed by both substrates spreads to the periphery and as a result spreads to the entire display region D1. As is shown in FIG. 5 and FIG. 6, the second wall part E2 and second bonding material 825 are provided in a ring shape in this example.

After the first large substrate 1Y and second large substrate 2Y are pushed together, the first bonding material 815 and second bonding material 825 which spread as a result are hardened using ultraviolet radiation and thereby the first large substrate 1Y and second large substrate 2Y are bonded together. In addition, the first support substrate 10Y and second support substrate 20Y are cut at the position of the broken lines SL1 and SL2.

At the time of cutting, the closer the distance between the second bonding material 820 and the cutting position, it become possible to further narrow the frame section of the display device 1000 and reduce cutting defects. This principle is explained below.

[Effects of a Cutting Margin]

Figure 7A:
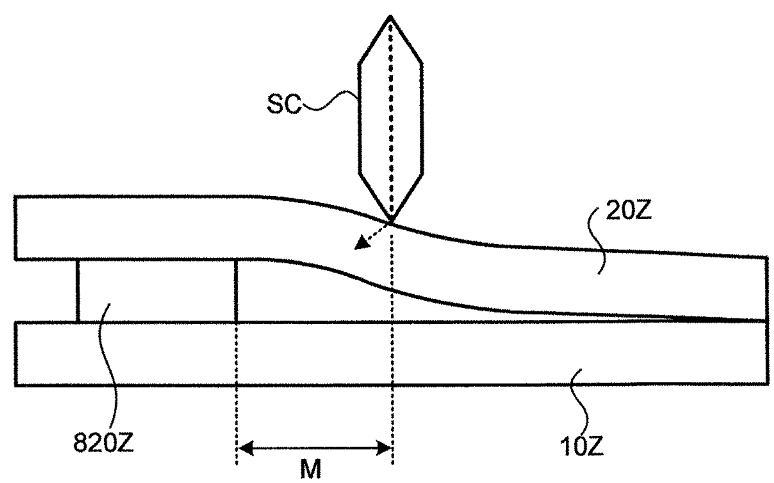
FIG. 7A is a diagram explaining the effects of a difference in distance between a second bonding material and substrate cutting device when cutting a substrate.
Figure 7B:
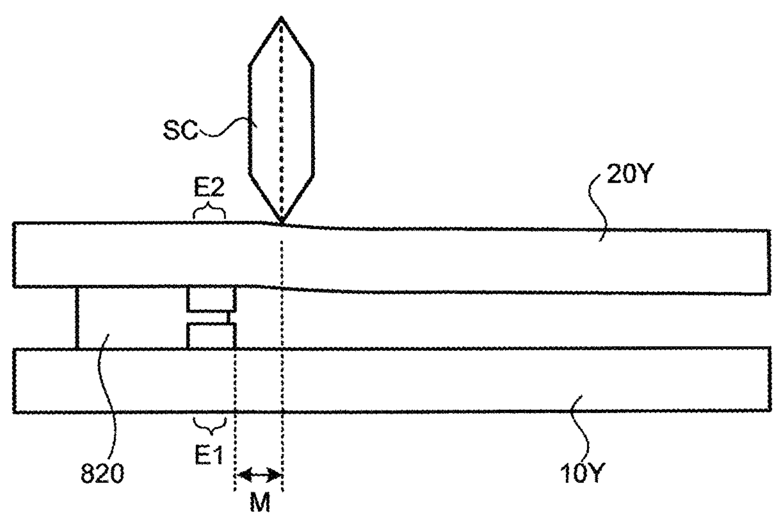
FIG. 7B is a diagram explaining the effects of a difference in distance between a second bonding material and substrate cutting device when cutting a substrate.

FIG. 7A and FIG. 7B are diagrams explaining the effects due to the difference in distance between the second bonding material and a substrate cutting position when cutting a substrate. FIG. 7A shows the case where the distance (referred to below simply as cutting margin M) between the second bonding material and a substrate cutting position is large. FIG. 7B shows the case where the cutting margin M can be reduced due to the existence of the first wall part E1 and second wall part E2.

As is shown in FIG. 7A, in the case where there is no structure corresponding the first wall part E1 and second wall part E2, because positional accuracy of the second bonding material 820Z is poor, it is necessary to increase the cutting margin M. In this case, when a blade SC for cutting is pushed against the second support substrate 20Z, the end part of the second bonding material 820Z becomes a support point and the second support substrate 20Z significantly bends. As a result, the force of the blade SC applied to the second support substrate 20Z is directed in the thickness direction of the second support substrate 20Z, for example, the substrate is sometimes cut in the direction of the arrow which can lead to cutting defects.

On the other hand, in the case of provided the first wall part E1 and second wall part E2 as is shown in FIG. 7B, because the position of the end of the second bonding material 820 can be confirmed by the positional accuracy of the first wall part E1 and second wall part E2, it is possible to reduce the cutting margin M compared to the case shown in FIG. 7A. As a result, even if the blade SC is pressed against the second support substrate 20Y, it is possible to reduce bending of the second support substrate 20Y, the force of the blade SC is applied in the thickness direction of the second support substrate 20Y and it is difficult for substrate cutting defects to occur.

As described above, in the present embodiment, by using the first wall part E1 and second wall part E2 formed using photolithography with a better positional accuracy when discharging the second bonding material 825, it is possible to control spreading of the second bonding material 820 to the substrate exterior side and increase positional accuracy of the end part of the second bonding material 820.

Second Embodiment

In the second embodiment an example in which a slit is formed in the light shielding layer 950 in the first embodiment is explained.

Figure 8:
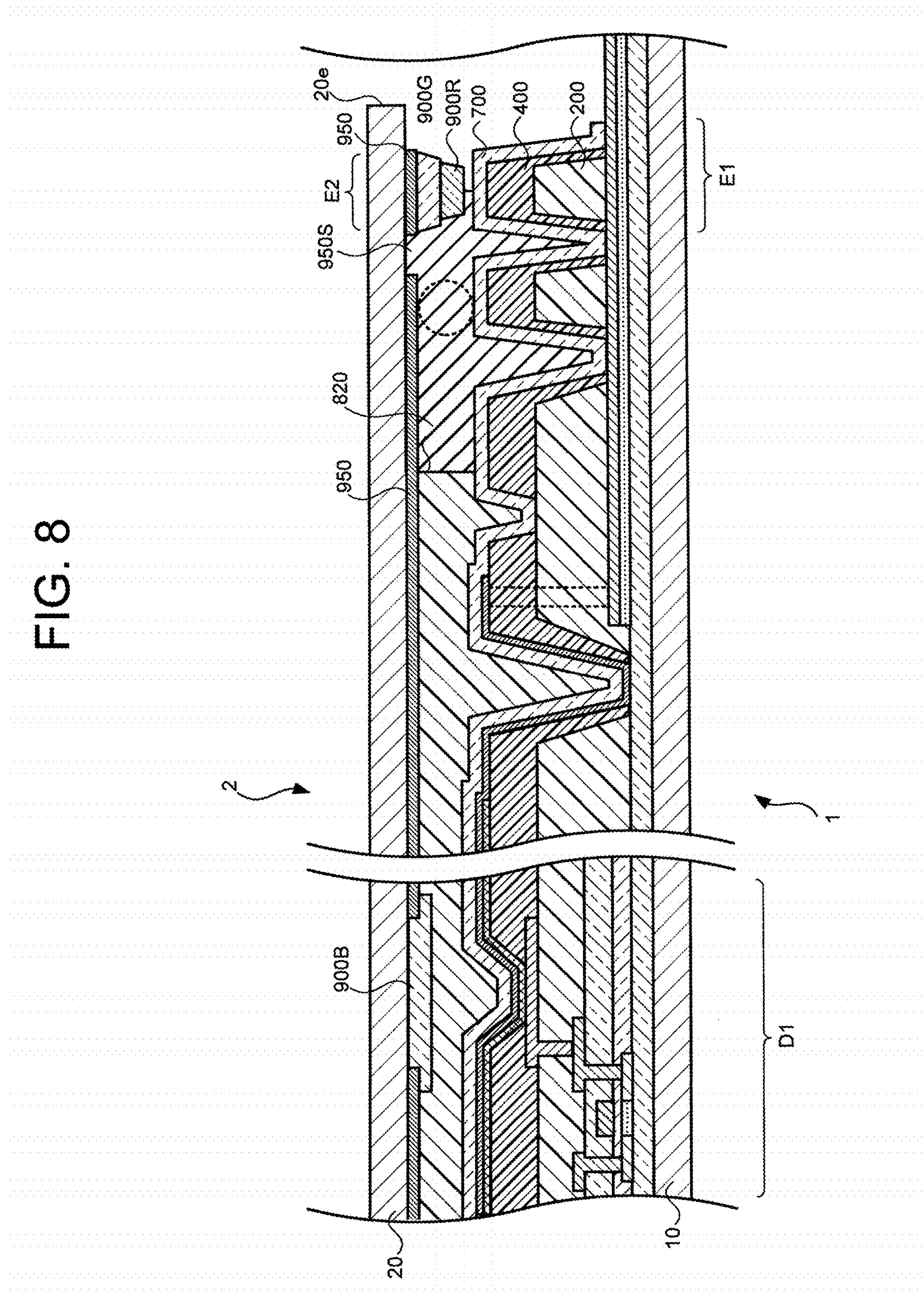
FIG. 8 is a planar view diagram showing a cross-sectional structure of a display device in the second embodiment of the present invention.

FIG. 8 is a schematic diagram showing a cross-sectional structure of a display device in the second embodiment of the present invention. As is shown in FIG. 8, a slit 950S is formed in the shielding layer 950 in the display region D1 side of the second wall part E2. The slit 950S is formed along the second wall part E2 and is formed in a ring shape when seen in a planar view corresponding to FIG. 5. Furthermore, the slit 950S is not required to have a ring shape and may be formed just in one part of the display region side D1 of the second wall part E2.

By forming the slit 959S, the light shielding layer 950 stacked in the second wall part E2 is separated from other parts of the light shielding layer 950 and the separated region is formed adjacent to the second wall part E2 as a recessed part. When the second bonding material 825 before curing flows into the recessed part, it is possible to control the second bonding material 825 from exceeding the second wall part E2 and protruding to the exterior.

Third Embodiment

In the third embodiment, an example in which another wall part is provided on the exterior side of the first wall part E1 and second wall part E2 in the first embodiment.

Figure 9:
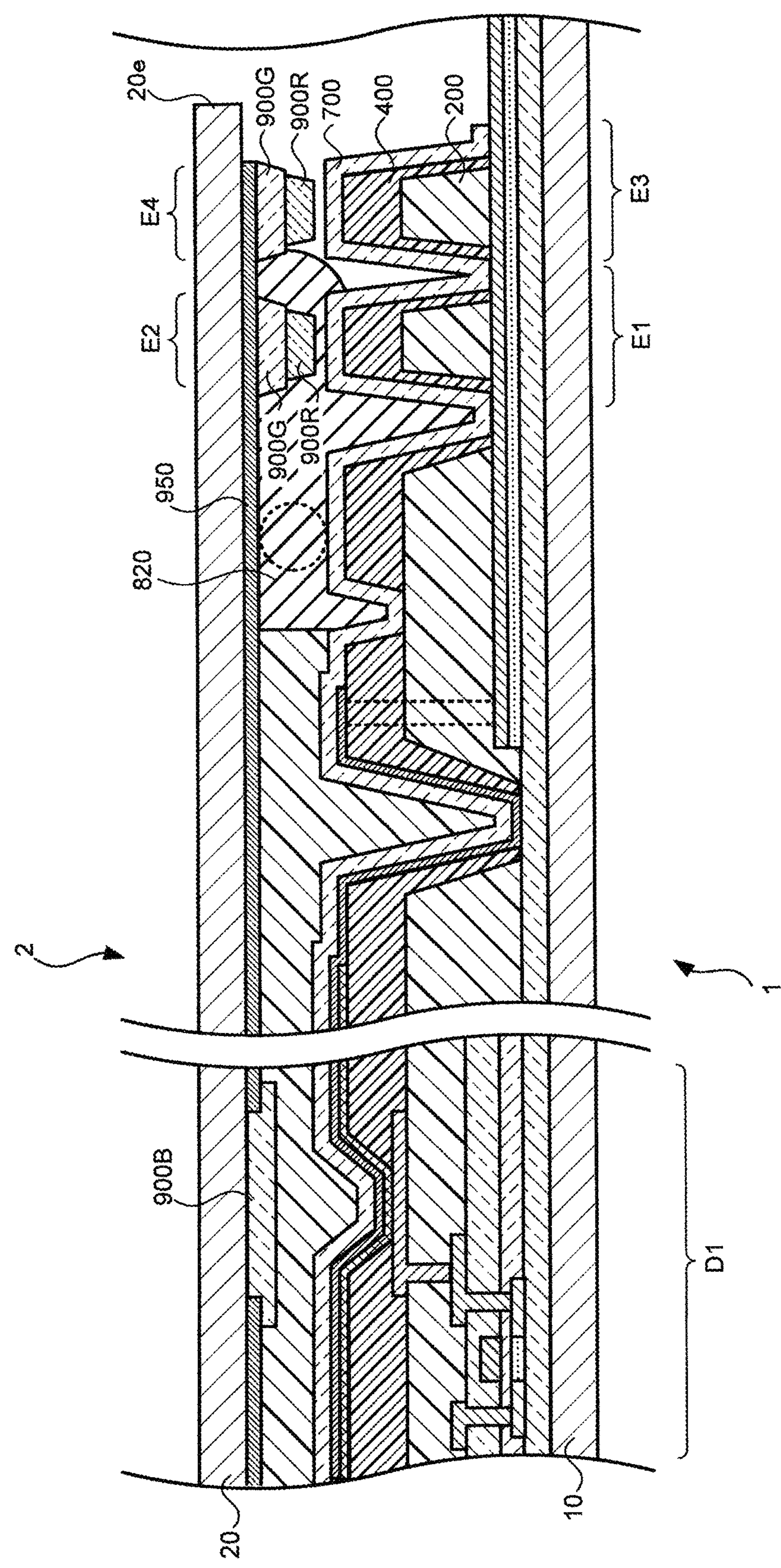
FIG. 9 is a planar view diagram showing a cross-sectional structure of a display device in the third embodiment of the present invention.
Figure 10:
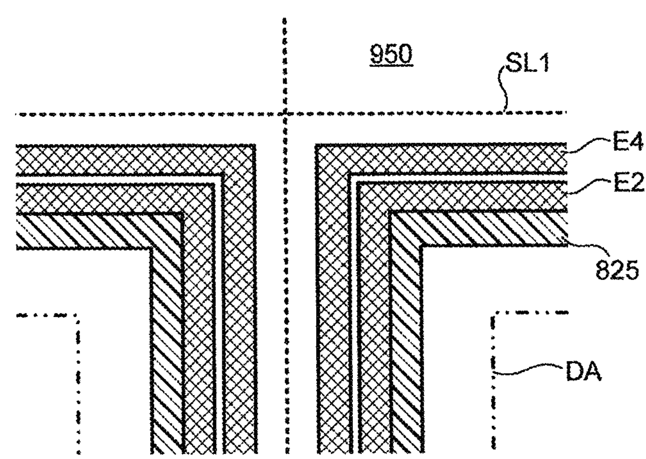
FIG. 10 is a diagram explaining the positional relationship between a second wall part, fourth wall part and bonding material in the third embodiment of the present invention.

FIG. 9 is a schematic diagram showing a cross-sectional structure of a display device in the third embodiment of the present invention. FIG. 10 is a diagram showing the positional relationship between the second wall part, a fourth wall part and the second bonding material in the third embodiment of the present invention. FIG. 10 corresponds to FIG. 5 described above.

As is shown in FIG. 9 and FIG. 10, a third wall part E3 is formed in the same way as the first wall part E1 on the exterior side of the first wall part E1 and a fourth wall part E4 is formed in the same way as the second wall part E2 on the exterior side of the second wall part E2. The third wall part E3 and fourth wall part E4 are provided facing each other. The third wall part E3 and fourth wall part E4 are also formed in a ring shape the same as the first wall part E1 and second wall part E2. As is shown in FIG. 10, the second bonding material 825 before curing may be discharged on the display region D1 side of the second wall part E2.

In this way, by forming another wall part on the exterior side of the second wall part E2, even if the second bonding material 825 before curing exceeds the second wall part E2 and protrudes to the exterior, it is possible to control the second bonding material 825 from further protruding using the third wall part E3 and fourth wall part E4 as shown in FIG. 9.

Furthermore, in the third embodiment, a slit may be further provided in a part of the light shielding layer 950 as in the second embodiment. The slit may be provided in the display region D1 side of the second wall part E2 as in the second embodiment, between the second wall part E2 and fourth wall part E4 or both.

Fourth Embodiment

In the fourth embodiment of the present invention, an example in which the first wall part E1 and second wall part E2 are in contact in the first embodiment are explained.

Figure 11:
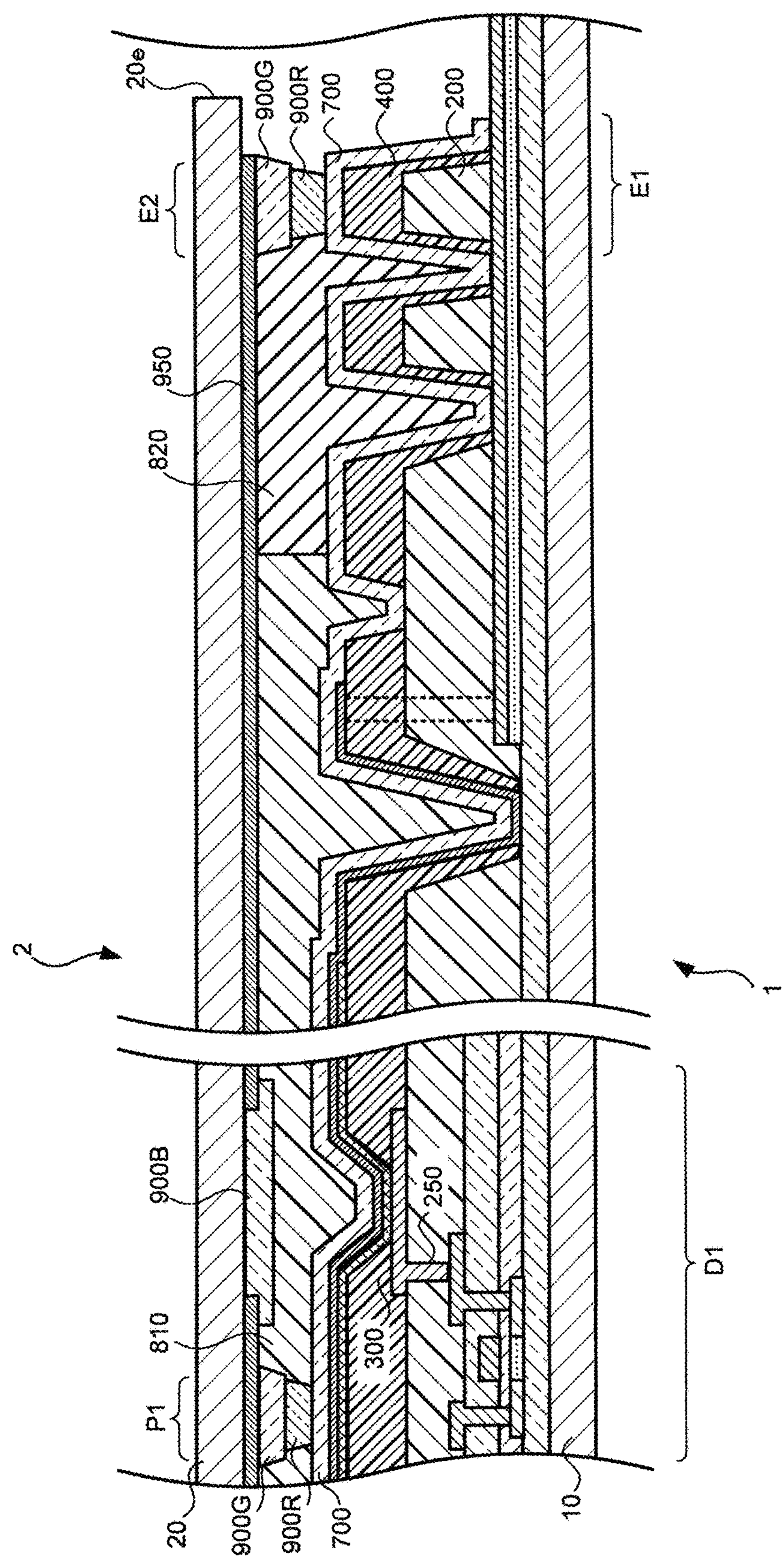
FIG. 11 is a schematic diagram showing a cross-sectional diagram in the fourth embodiment of the present invention.

FIG. 11 is a schematic diagram showing a cross-sectional structure of a display device in the fourth embodiment of the present invention. As is shown in FIG. 11, the first wall part E1 and second embodiment E2 are in contact. In addition, in the display region D1, a column part P1 is provided to contact a sealing layer 700 in a location apart from a light emitting region of a pixel. The column part P1 is formed from the same material as the second wall part E2.

On the other hand, the spacer 830 in the first embodiment is not included in the second bonding material 820. In this example, the second wall part E2 and column part P1 perform the role of the spacer 830 adopting a column shaped spacer.

Fifth Embodiment

In the fifth embodiment describe an example in which the bonding material 820 in the fourth embodiment is excluded.

Figure 12:
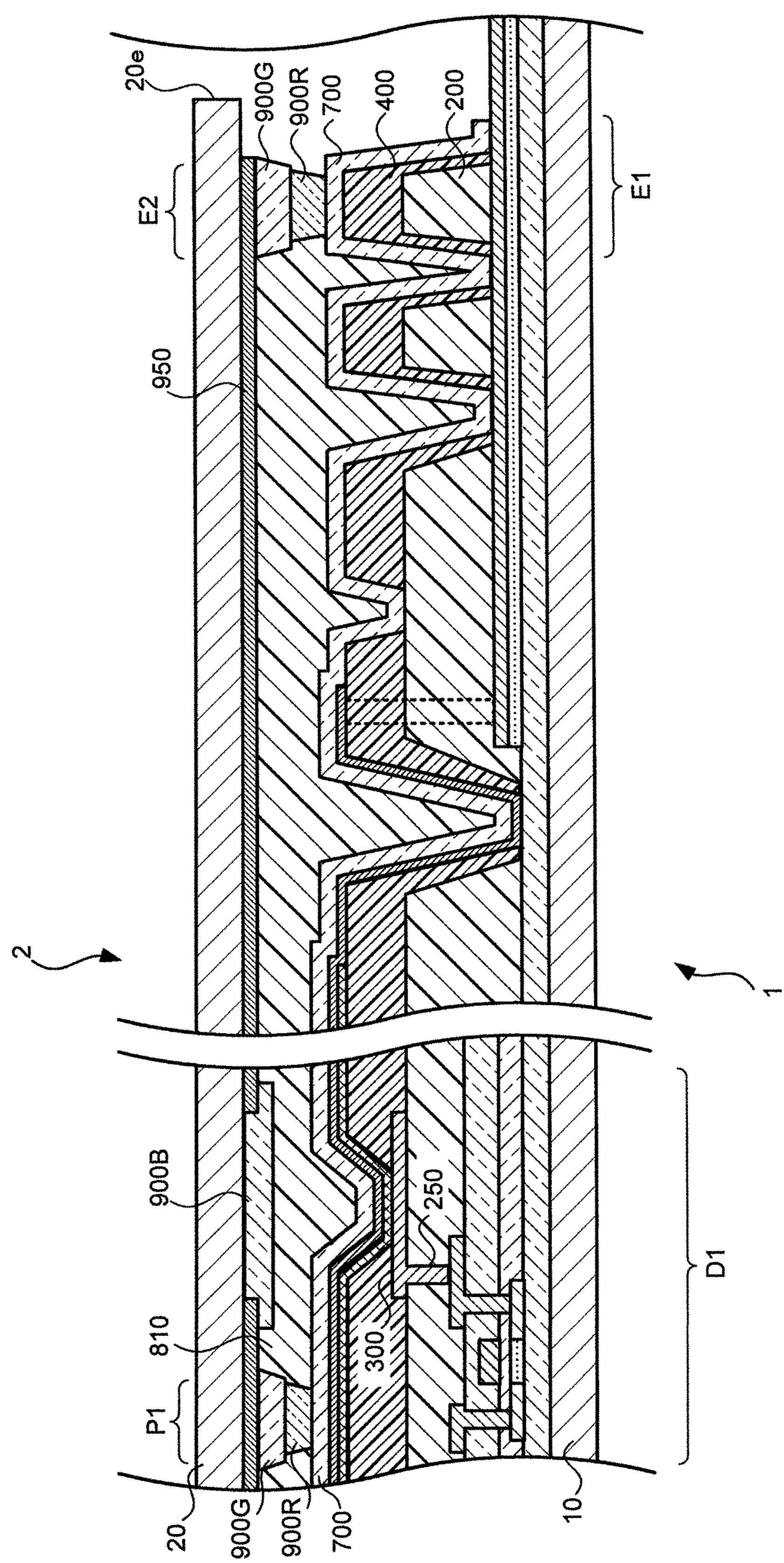
FIG. 12 is a schematic diagram showing a cross-sectional diagram in the fifth embodiment of the present invention.

FIG. 12 is a schematic diagram showing a cross-sectional structure of a display device in a fifth embodiment of the present invention. As is shown in FIG. 12, in the structure in the fourth embodiment, the second bonding material 820 does not exist and the first bonding material 810 spreads up to a location where the first wall part E1 and second wall part are in contact. In this way, since it is possible for the first wall part E1 and the second wall part E2 to play the role corresponding to a dam material which blocks the first bonding material 810 by contacting the first wall part E1 and the second wall part E2, there is no need for the second bonding material 820. In addition, the first bonding material 810 is finally cured. As a result, the first wall part E1 and second wall part E2 may play the role corresponding to a dam material until curing is performed and this role may be lost after curing. That is, the first wall part E1 and second wall part E2 may be contact sufficient enough to control the spread of the first bonding material 810 until it cures.

In the fourth and fifth embodiments, the column part P1 in the display area D1 is provided in a location except a light emitting region. For example, an example arrangement of the column part P1 is explained in the case where color pixels R (red), green (G), B (blue) and white (W) are included.

Figure 13:
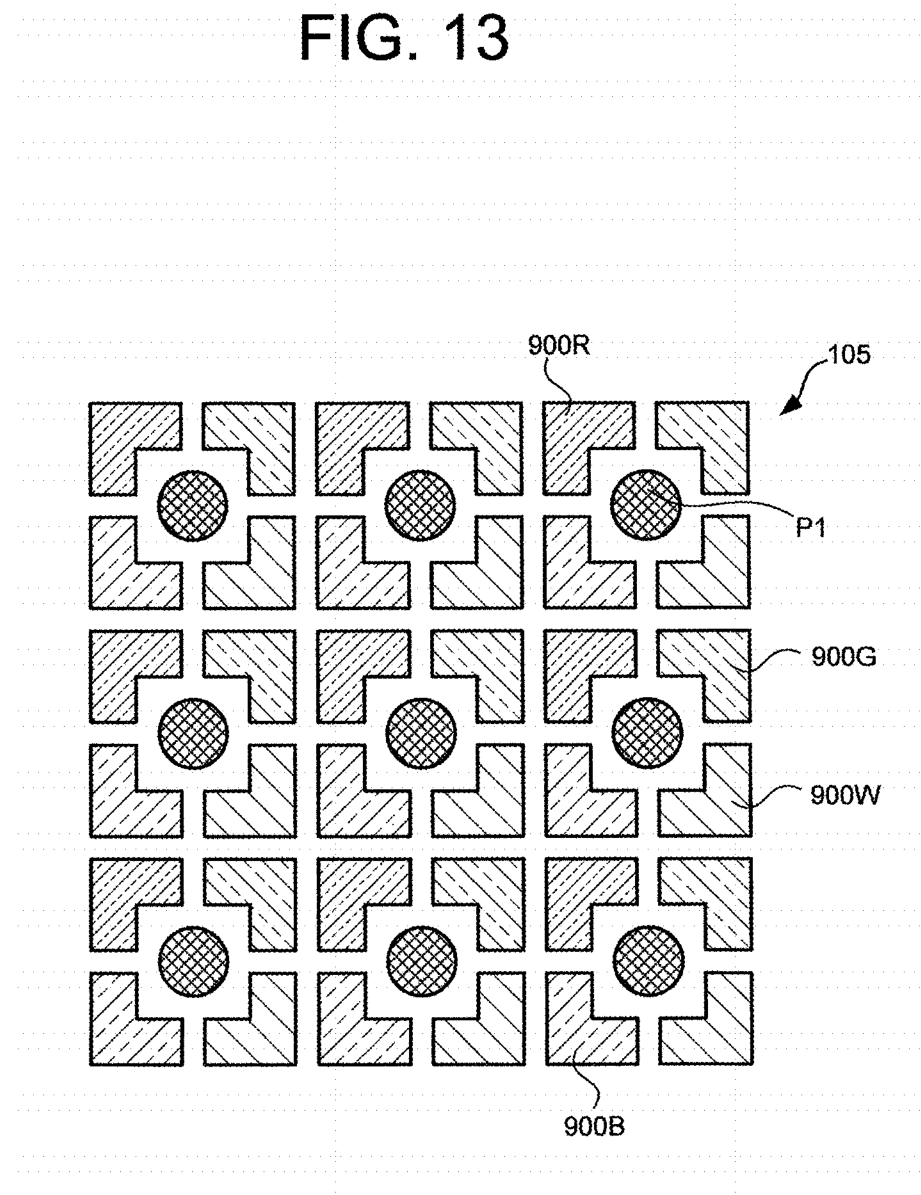
FIG. 13 is a diagram showing an example of a positional relationship between a column part and each pixel in the fourth and fifth embodiments of the present invention.

FIG. 13 is a diagram explaining an example of the positional relationship between a column part in the fourth and fifth embodiments and each pixel. In the example in FIG. 13, color filters 900R, 900G, 900B and 900W are provided corresponding to a light emitting region in each color pixel. The column part P1 is provided in a roughly rectangular region where these color filters are not provided and where the light shielding layer 950 is exposed. Furthermore, the color filter 900 may be an acrylic resin including a pigment corresponding to a W display color or an acrylic resin which does not include a pigment.

In the examples in the fourth and fifth embodiments, although the column part P1 has structure in which the color filters 900R, 900G are stacked, the present invention is not limited to a stacked structure, a stacked structure combining a different color filter is possible and the number of stacked layers is not limited to two layers.

Other Embodiments

Although the display device 1000 described above is a display using an OLED as a light emitting element, the display device 1000 may also be a display using other light emitting elements. In addition, the display device 1000 may be applied to a liquid crystal display and in the case the second bonding material 820 may be a sealing material for sealing the liquid crystals.

In the category of the concept of the present invention, it would be easy for a person ordinarily skilled in the art to conceive of various modifications and corrections and those modifications and correction are included in the scope of the present invention. For example, with respect to each embodiment described above, a person ordinarily skilled in the art could make additions, deletions or design changes to structural elements where appropriate or add, omit or change conditions of processes and as long as they do not depart from the scope of the present invention, these are included in the present invention.

What is claimed is:

1. A display device comprising:

a first substrate provided with a plurality of display elements;

a second substrate provided facing the display element;

a bonding material bonding the first substrate and second substrate;

a first wall part provided over the second substrate side of the first substrate and enclosing a display region facing a position of the display element;

a second wall part provided over the first substrate side of the second substrate and enclosing a structure body facing a position of the display element and a display region;

the first wall part comprises the same material as at least part of the material constituting the display element;

the second wall part is provided from the same material as at least part of the material constituting the structure body; and the first wall part and second wall part are in contact using the bonding material in the display region side, wherein the bonding material includes a first bonding material provided in the display region and a second bonding material in contact with the second wall part on the exterior side of the display region, and the second bonding material has a lower transparency at a certain wavelength including in visible light than the first bonding material.

2. The display device according to claim 1, wherein the second bonding material is sandwiched between the first wall part and second wall part.

3. The display device according to claim 2, wherein the first bonding material is provided in the display region, and the second bonding material has a stronger force when bonding the first substrate and second substrate per unit area from a planar view than the first bonding material.

4. The display device according to claim 1, wherein the second bonding material contains a spacer for separating a certain distance to the first substrate and the second substrate.

5. The display device according to claim 1, wherein the first wall part and second wall part are in contact.

6. The display device according to claim 4, wherein a spacer is provided in the display region of the second substrate so that the first substrate and second substrate do no approach each other closer than a certain distance, and the spacer is formed from a material used to form the second wall part.

7. The display device according to claim 1, wherein the first substrate is provided with a third wall part on the exterior periphery side of the first wall part, and the second substrate is provided with a fourth wall part on the exterior periphery side of the second wall part.

8. The display device according to claim 1, wherein the structure body includes a color filter which displays different colors according to a position of the display element, and the second wall part includes a structure wherein at least a plurality of the color filters are stacked.

9. The display device according to claim 8, wherein the structure body includes a light shielding layer provided between the color filters displaying different colors, and the second wall part includes a structure wherein the light shielding layer is further stacked on the stacked structure.

10. The display device according to claim 9, wherein the light shielding layer includes a light shielding region spreading towards the second wall part from an exterior edge of at least the display region.

11. The display device according to claim 10, wherein the light shielding layer included in the second wall part is separated from the light shielding layer in the light shielding region.

* * * * *